United States Patent
Hu et al.

(10) Patent No.: US 8,595,544 B2
(45) Date of Patent: Nov. 26, 2013

(54) AUTOMATIC INTERNAL TRIMMING CALIBRATION METHOD TO COMPENSATE PROCESS VARIATION

(71) Applicant: Macronix International Co., Ltd., Hsinchu (TW)

(72) Inventors: Chih-Ting Hu, Tainan (TW); Ken-Hui Chen, Taichung County (TW); Chun-Hsiung Hung, Hsinchu (TW)

(73) Assignee: Macronix International Co., Ltd., Hsinchu (TW)

( * ) Notice: Subject to any disclaimer, the term of this patent is extended or adjusted under 35 U.S.C. 154(b) by 0 days.

(21) Appl. No.: 13/753,943

(22) Filed: Jan. 30, 2013

(65) Prior Publication Data

US 2013/0145201 A1    Jun. 6, 2013

Related U.S. Application Data

(62) Division of application No. 12/486,573, filed on Jun. 17, 2009, now Pat. No. 8,386,829.

(51) Int. Cl.
  *G06F 1/04* (2006.01)
  *G06F 1/24* (2006.01)
  *G06F 11/00* (2006.01)
(52) U.S. Cl.
  USPC ........................................................ 713/503
(58) Field of Classification Search
  USPC ........................................................ 713/503
  See application file for complete search history.

(56) References Cited

U.S. PATENT DOCUMENTS

| | | | |
|---|---|---|---|
| 4,542,505 A | | 9/1985 | Binoeder et al. |
| 4,788,684 A | * | 11/1988 | Kawaguchi et al. ......... 714/719 |
| 5,361,001 A | | 11/1994 | Stolfa |
| 5,754,616 A | | 5/1998 | Miura |
| 5,805,872 A | * | 9/1998 | Bannon ........................ 713/500 |
| 5,874,863 A | | 2/1999 | Wojewoda et al. |
| 5,918,041 A | | 6/1999 | Berstis |
| 6,072,368 A | | 6/2000 | Galbraith et al. |
| 6,169,393 B1 | | 1/2001 | Hashimoto |
| 6,192,092 B1 | | 2/2001 | Dizon et al. |
| 6,208,665 B1 | | 3/2001 | Loukianov et al. |

(Continued)

FOREIGN PATENT DOCUMENTS

| | | |
|---|---|---|
| EP | 0540119 A2 | 5/1993 |
| EP | 1956480 A1 | 8/2008 |

(Continued)

OTHER PUBLICATIONS

Takahashi, E.; Kasai, Y.; Murakawa, M.; Higuchi, T., "Post-fabrication clock-timing adjustment using genetic algorithms," Solid-State Circuits, IEEE Journal of , vol. 39, No. 4, pp. 643,650, Apr. 2004.*

(Continued)

*Primary Examiner* — Faisal M Zaman
(74) *Attorney, Agent, or Firm* — Stout, Uxa, Buyan & Mullins, LLP

(57) ABSTRACT

A method is described for performing an automatic internal trimming operation that can compensate process variation and supply voltage variation in an integrated circuit. A reference signal is applied when the integrated circuit is in an automatic internal trimming mode, and integrated circuit timing is trimmed into a predetermined target range after applying predefined reference cycles.

5 Claims, 3 Drawing Sheets

(56) References Cited

U.S. PATENT DOCUMENTS

| | | | |
|---|---|---|---|
| 6,281,734 B1 | 8/2001 | McClure et al. | |
| 6,347,380 B1* | 2/2002 | Chang et al. | 713/503 |
| 6,456,563 B1* | 9/2002 | Kajimoto | 365/233.14 |
| 6,499,111 B2 | 12/2002 | Mullarkey | |
| 6,581,164 B1* | 6/2003 | Felts et al. | 713/400 |
| 6,611,922 B2 | 8/2003 | Ozcetin et al. | |
| 6,762,636 B1 | 7/2004 | Khawshe | |
| 6,763,444 B2* | 7/2004 | Thomann et al. | 711/170 |
| 6,882,238 B2 | 4/2005 | Kurd et al. | |
| 6,950,956 B2* | 9/2005 | Zerbe et al. | 713/400 |
| 6,954,871 B2* | 10/2005 | Kuhn | 713/401 |
| 7,155,627 B2* | 12/2006 | Matsui | 713/401 |
| 7,269,754 B2* | 9/2007 | Ramaswamy et al. | 713/401 |
| 7,454,537 B1* | 11/2008 | Xue | 710/52 |
| 7,496,781 B2 | 2/2009 | Tamura et al. | |
| 7,617,409 B2 | 11/2009 | Gilday et al. | |
| 7,711,973 B2* | 5/2010 | Sakamaki | 713/400 |
| 7,752,420 B2* | 7/2010 | Izawa et al. | 712/15 |
| 7,818,528 B2* | 10/2010 | Hughes | 711/167 |
| 7,872,510 B2 | 1/2011 | Lee | |
| 7,969,213 B2 | 6/2011 | Kim | |
| 8,132,136 B2 | 3/2012 | Bueti et al. | |
| 8,207,976 B2* | 6/2012 | Hein | 345/519 |
| 8,248,873 B2* | 8/2012 | Bae et al. | 365/201 |
| 2001/0007091 A1 | 7/2001 | Walter et al. | |
| 2001/0044702 A1 | 11/2001 | Rocchi et al. | |
| 2003/0046598 A1* | 3/2003 | Crafts et al. | 713/503 |
| 2003/0109237 A1 | 6/2003 | Chien et al. | |
| 2004/0104753 A1 | 6/2004 | Haraguchi et al. | |
| 2005/0024111 A1 | 2/2005 | Ruat et al. | |
| 2005/0073868 A1 | 4/2005 | Hsieh et al. | |
| 2005/0246600 A1 | 11/2005 | Pistoulet | |
| 2006/0047459 A1 | 3/2006 | Underbrink et al. | |
| 2006/0179360 A1 | 8/2006 | Nakamura et al. | |
| 2006/0209966 A1 | 9/2006 | Walker | |
| 2007/0019770 A1 | 1/2007 | Bradley et al. | |
| 2007/0057952 A1 | 3/2007 | Swedberg et al. | |
| 2007/0172010 A1 | 7/2007 | Hilgendorf et al. | |
| 2007/0237171 A1 | 10/2007 | Graef | |
| 2008/0024181 A1 | 1/2008 | Wada | |
| 2008/0150645 A1 | 6/2008 | McCorquodale et al. | |
| 2008/0197965 A1 | 8/2008 | Onishi | |
| 2008/0252236 A1 | 10/2008 | Lee et al. | |
| 2008/0284408 A1 | 11/2008 | Kunst et al. | |
| 2009/0088821 A1 | 4/2009 | Abrahamson | |
| 2009/0146742 A1 | 6/2009 | Onishi et al. | |
| 2009/0231050 A1 | 9/2009 | Lin | |
| 2009/0243735 A1 | 10/2009 | Luiz et al. | |
| 2009/0271652 A1* | 10/2009 | Song et al. | 713/503 |
| 2009/0327535 A1* | 12/2009 | Liu | 710/52 |
| 2011/0156785 A1 | 6/2011 | Bettini et al. | |

FOREIGN PATENT DOCUMENTS

| | | | | |
|---|---|---|---|---|
| JP | 60211696 A | * | 10/1985 | G11C 11/34 |
| JP | 61129922 A | | 6/1986 | |
| JP | 61206318 A | | 9/1986 | |
| JP | 04249439 A | * | 9/1992 | H04L 7/00 |
| JP | 06036472 A | | 2/1994 | |
| JP | 08204548 A | | 8/1996 | |
| JP | 09297968 A | | 11/1997 | |
| TW | 1247124 B | | 1/2006 | |
| TW | I296838 B | | 5/2008 | |

OTHER PUBLICATIONS

Furuichi, S.; Ueda, Y.; Wadatt, A.; Takahashi, E.; Murakawa, M.; Susa, T.; Higuchi, T., "A low-power DCT chip utilizing post-fabrication clock-timing adjustment with area reductions and adjustment speed enhancements," Solid-State Circuits Conference, 2007. ASSCC '07. IEEE Asian , pp. 268,271, Nov. 12-14, 2007.*

Kutschera, C.; Groblinger, A; Holler, R.; Gemeiner, C.; Kero, N.; Cadek, G.R.; "IEEE 1588 clock synchronization over IEEE 802.3/10 GBit ethernet," Precision Clock Synchronization for Measurement Control and Communication (ISPCS), 2010 International IEEE Symposium on, pp. 71-76, Sep. 27, 2010-Oct. 1, 2010.

Friedman, E.G.; "Clock distribution networks in synchronous digital integrated circuits," Proceedings of the IEEE, vol. 89, No. 5, pp. 665-692, May 2001.

Sakallah, K.A.; Mudge, T.N.; Burks, T.M.; Davidson, E.S.; "Synchronization of pipelines," Computer-Aided Design of Integrated Circuits and Systems, IEEE Transactions on, vol. 12, No. 8, pp. 1132-1146, Aug. 1993.

Myint Wai Phyu; Kangkang Fu; Wang Ling Goh; Kiat-Seng Yeo; "Power-Efficient Explicit-Pulsed Dual-Edge Triggered Sense-Amplifier Flip-Flops," Very Large Scale Integration (VLSI) Systems, IEEE Transactions on, vol. 19, No. 1, pp. 1-9, Jan. 2011.

* cited by examiner

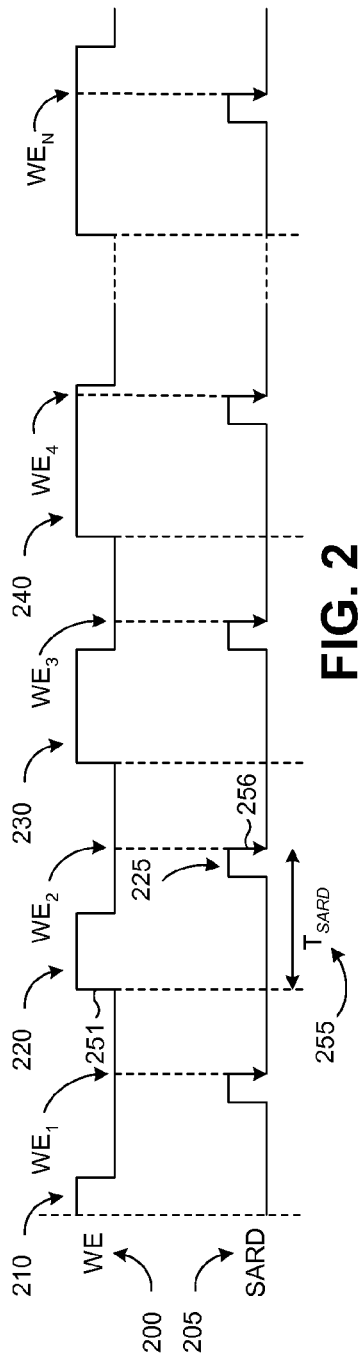
FIG. 2
FIG. 3A
FIG. 3B

AUTOMATIC INTERNAL TRIMMING CALIBRATION METHOD TO COMPENSATE PROCESS VARIATION

CROSS-REFERENCE TO RELATED APPLICATIONS

This application is a divisional of U.S. application Ser. No. 12/486,573, filed on Jun. 17, 2009 and entitled AUTOMATIC INTERNAL TRIMMING CALIBRATION METHOD TO COMPENSATE PROCESS VARIATION, the entire contents of which are hereby incorporated by reference.

BACKGROUND OF THE INVENTION

1. Field of the Invention

The present invention relates generally to semiconductors and, more particularly, to a method for compensating for process variations in the manufacturing of semiconductor devices.

2. Description of Related Art

Integrated circuit memory technology continues to evolve toward smaller and smaller geometries. While reductions in channel-lengths and gate-oxide thicknesses in metal-oxide-semiconductor (MOS—, e.g., PMOS, NMOS, CMOS) memories can be used to improve memory performance relative to, for example, read/write speeds, such design changes often lead to increased sensitivity to manufacturing process variations and to greater sensitivity to variations in external supply voltage and temperature.

Data in integrated circuit memories must be read out in relatively short times. Read speed is critical in applications such as mobile phones and digital versatile disk (DVD) players. In order to be acceptable for use in these contexts, a need exists in the prior art for reliably controlling read-speed timing of integrated circuit memories within predetermined ranges. Further, a need exists for maintaining the read speeds within the predetermined ranges, even in the presence of variations in external supply voltage, temperature and process variations, any of which may be introduced into an environment of mass semiconductor device production.

SUMMARY OF THE INVENTION

The present invention addresses these needs by providing an automatic internal trimming calibration method of manufacture of an integrated circuit that can compensate for variations in a manufacturing process. An implementation of the method of trimming timing in an integrated circuit comprises applying a reference signal to the integrated circuit and comparing the reference signal to an internal signal generated from the integrated circuit. The implementation further comprises performing automatic trimming to adjust the internal signal according to a result of the comparing. According to an implementation of the method, the adjusting comprises adjusting at least one internal parameter of the integrated circuit. In another implementation of the method, the adjusting of the internal signal comprises blowing internal fuses, thereby changing a configuration of resistors in order to change a resistance value that controls a frequency of a clock signal. In still another implementation of the method, the adjusting of the internal signal comprises blowing internal fuses, thereby changing a configuration of resistors in order to change a resistance value that controls an internal power supply voltage. Another implementation of the method performs automatic trimming after the applying of the reference signal and an integrated circuit configuration is stored according to a result of the automatic trimming. The integrated circuit may be passed or failed according to a result of the comparing.

While the apparatus and method has or wilt be described for the sake of grammatical fluidity with functional explanations, it is to be expressly understood that the claims, unless expressly formulated under 35 U.S.C. 112, are not to be construed as necessarily limited in any way by the construction of "means" or "steps" limitations, but are to be accorded the full scope of the meaning and equivalents of the definition provided by the claims under the judicial doctrine of equivalents, and in the case where the claims are expressly formulated under 35 U.S.C. 112 are to be accorded full statutory equivalents under 35 U.S.C. 112.

Any feature or combination of features described herein are included within the scope of the present invention provided that the features included in any such combination are not mutually inconsistent as will be apparent from the context, this specification, and the knowledge of one skilled in the art. In addition, any feature or combination of features may be specifically excluded from any embodiment of the present invention. For purposes of summarizing the present invention, certain aspects, advantages and novel features of the present invention are described. Of course, it is to be understood that not necessarily all such aspects, advantages or features will be embodied in any particular implementation of the present invention. Additional advantages and aspects of the present invention are apparent in the following detailed description and claims that follow.

BRIEF DESCRIPTION OF THE FIGURES

FIG. 2 is a chart illustrating reference signals and an internal signal of an integrated circuit;

FIG. 3A is a table depicting conditions under which automatic trimming may occur in an integrated circuit;

FIG. 3B is a graphical interpretation of the table of FIG. 3A; and

DETAILED DESCRIPTION OF THE PRESENTLY PREFERRED EMBODIMENTS

Figure 1:
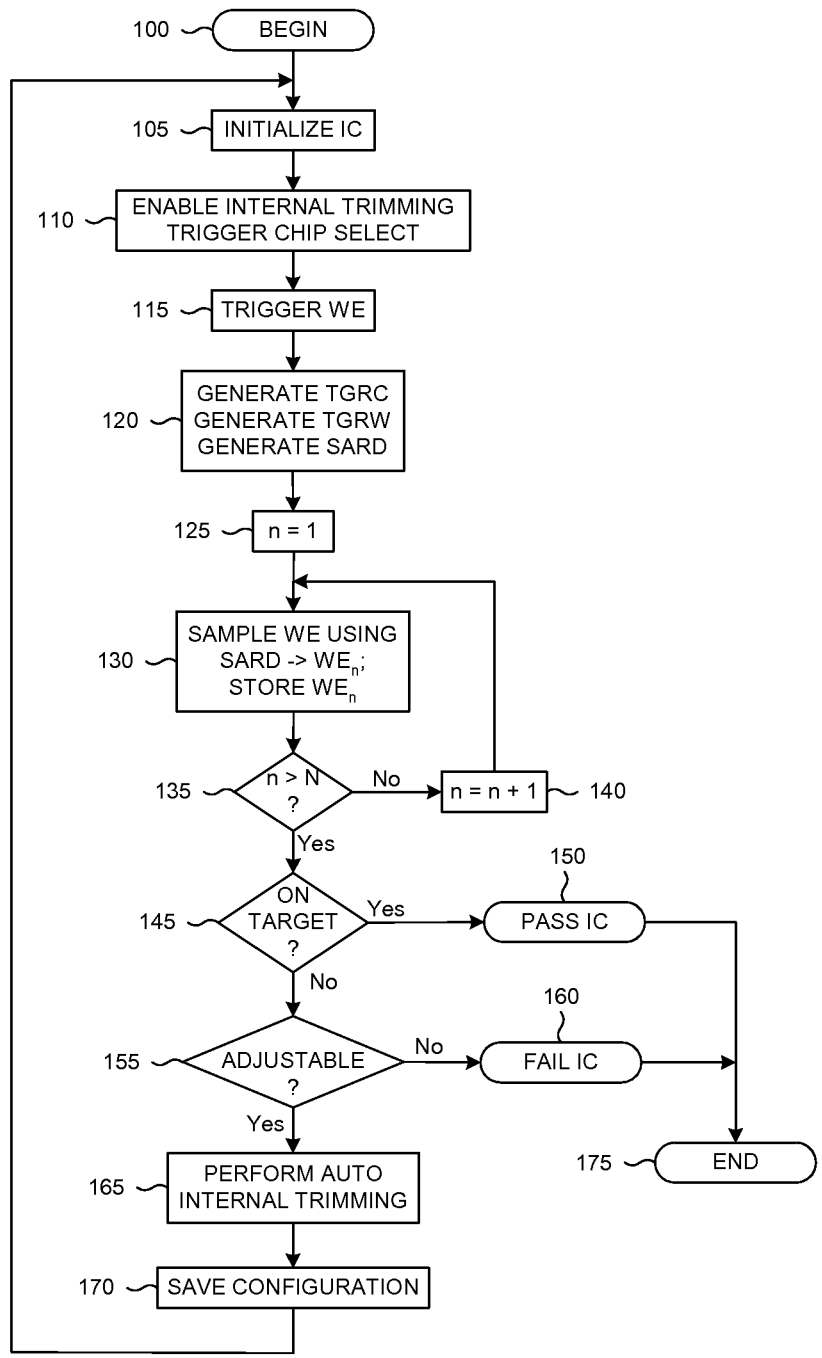
FIG. 1 is flow diagram describing an implementation of an automatic internal trimming calibration method.

Reference will now be made in detail to the presently preferred embodiments of the invention, examples of which are illustrated in the accompanying drawings. Wherever possible, the same or similar reference numbers are used in the drawings and the description to refer to the same or like parts. It should be noted that the drawings are in simplified form and are not presumed, automatically, to be to precise scale in all embodiments. That is, they are intended to be examples of implementations of various aspects of the present invention and, according to certain but not all embodiments, to be to-scale. While, according to certain implementations, the structures depicted in these figures are to be interpreted to be to scale, in other implementations the same structures should not. In certain aspects of the invention, use of the same reference designator numbers in the drawings and the following description is intended to refer to similar or analogous, but not necessarily the same, components and elements. According to other aspects, use of the same reference designator numbers in these drawings and the following description is intended to be interpreted as referring to the same or substantially the same, and/or functionally the same, components and elements. In reference to the disclosure herein, for purposes of convenience and clarity only, directional terms, such as, top, bottom, left, right, up, down, over, above, below, beneath, rear, and front, are used with respect to the accompanying drawings. Such directional terms should not be construed to limit the scope of the invention in any manner.

Although the disclosure herein refers to certain illustrated embodiments, it is to be understood that these embodiments are presented by way of example and not by way of limitation. The intent accompanying this disclosure is to discuss exemplary embodiments with the following detailed description being construed to cover all modifications, alternatives, and equivalents of the embodiments as may fall within the spirit and scope of the invention as defined by the appended claims. It is to be understood and appreciated that the process steps and structures described herein do not cover a complete process flow for the manufacture of the disclosed structures. The present invention may be practiced in conjunction with various integrated circuit fabrication and other techniques that are conventionally used in the art, and only so much of the commonly practiced process steps are included herein as are necessary to provide an understanding of the present invention. The present invention has applicability in the field of semiconductor devices and processes in general. For illustrative purposes, however, the following description pertains to a method of automatic internal trimming in the manufacture of semiconductor memories.

In high-density and high-speed memory systems, resistance, capacitance, process variation and supply voltage variation need to be taken into account. In a mass production environment, variation in a resistance-capacitance time constant may cause a system function (e.g., read/write) to fail. Such failures lead to relatively lower yields with a concomitant increase in production cost. Prior-art methods require that each integrated circuit (e.g., chip) be analyzed and then trimmed either faster or slower chip-by-chip. This individualized analyzing and trimming increases testing time and testing cost.

A method is described herein that can compensate for process variation and supply voltage variation in an integrated circuit. When the read speed timing is out of a predetermined range, the method can configure the timing to conform to the predetermined target automatically. Referring more particularly to the drawings, FIG. 1 is a flow diagram describing an implementation of an automatic internal trimming calibration method according to the present invention. The method may apply to automatically adjusting one or more internal parameters of an integrated circuit that is fabricated with an automatic trimming capability. That is, based upon certain measurements according to, for example, the implementation described in FIG. 1 and an exemplary implementation of an integrated circuit (cf. FIG. 4), parameter values in the integrated circuit may be changed. For example, internal fuses may be blown in order to change a configuration of series or parallel resistors to either increase or decrease a resistance value that may control a frequency of a clock signal. In other instances, an internal power supply voltage may be adjusted in a similar manner. Examples of such methods of parameter adjustment in integrated circuits are known to those skilled in the art.

The implementation of FIG. 1 begins at step 100 and continues at step 105 by initializing an integrated circuit, which may be referred to as a chip. For example, the integrated circuit, an example of which is described below with reference to FIG. 4, may be initialized upon receiving a power-on reset signal that may cause the integrated circuit to enter a known state. At step 110, a chip select signal may be applied (e.g., triggered), and a tester may present a signal to the integrated circuit that may cause the integrated circuit to enter a condition where automatic internal trimming is enabled. An external reference signal (identified as a WE signal 200 in FIG. 4) is applied (e.g., triggered by the tester) at step 115. According to the WE signal 200 (FIG. 4), signals internal to the chip may be generated. In the present example, signals TGRC 325, TGRW 330, and SARD 205 are generated. The TGRW signal 325 may function as an internal reference signal derived from the WE signal 200, and the SARD signal 205 may be generated by an internal timing circuit based upon the TGRC signal 325 and taking into account fuse information that may relate to a status of internal trimming in the chip.

According to a representative embodiment, the external reference signal WE 200 may comprise a sequence of pulses, each pulse in the sequence having a duty cycle greater than that of the previous pulse. An index, n, which may correspond to individual pulses in the external reference signal WE 200, may be initialized to a value of '1' at step 125. According to one exemplary mode of operation, the TGRC signal 325 may be an internal chip control signal used to synchronize a plurality of internal reference signals. These internal reference signals may control diverse circuit features such as program time, frequency duty cycle, read speed and the like. In particular, the TGRC signal 325 may trigger a read-speed timing reference signal that is critical to operation of a system (e.g., the chip), such as the SARD signal 205. If a read speed value falls outside a permissible operating range, a data read operation could be expected to fail and/or produce an incorrect data value, which may illustrate criticality of a signal such as the SARD signal 205. As further described below with reference to FIG. 4, the TGRW signal 330 may be generated according to user selections on an input pad of the external tester. The SARD signal 205 may be considered to be internally generated and so to be sensitive to, for example, manufacturing process variations as well as temperature and, in some cases, other factors, which may include internal power supply variations. At step 130, the TGRW signal 330 is sampled and stored according to the SARD signal 205, thereby producing a sample $WE_n$, which may be stored. At step 135, the index n may be compared with a maximum value of n, e.g., N. N may range from about 3 to about 10 and has values ranging from 3 to 5 in one exemplary embodiment. If n is not greater than N, then n is incremented, and the method continues at step 120. If n is greater than N, then the method continues at step 145 where a decision is made as to whether the $\{WE_n; n=1, 2, \ldots, N\}$ values measured and stored at step 130 are such that the chip may be passed.

The decision at step 145 may employ calculations illustrated in FIGS. 2 and 3. In FIG. 2, two signals, WE 200 and SARD 205, each comprising a sequence of pulses, are shown, where the pulses of the WE signal 200 (e.g., pulses 210, 220, 230, and 240) exhibit a duty cycle that increases with each pulse. According to one embodiment, a delay, $T_{SARD}$ 255, associated with the SARD signal 205 may be measured, a value of $T_{SARD}$ 255 being measured from a rising edge 251 of, for example, pulse 220 to a falling edge 256 of a pulse 225 of the SARD signal 205.

An interpretation of the signals shown in FIG. 2 is summarized in FIG. 3, which includes a table (FIG. 3A) illustrating conditions under which automatic trimming may occur in the chip. The table lists values $\{WE_n; n=1, 2, \ldots, N\}$ of the WE signal 200 sampled and latched at falling edges of the SARD signal 205. The sampled values may constitute a sequence of results of the sampling of the WE signal 200. Samples associated with a particular integrated circuit form a pattern corresponding to one of the rows in the table of FIG. 3A. One interpretation of the entries in the table is that an $n^{th}$ pulse of the SARD signal 205 having a rising edge that occurs after a rising edge of the $n^{th}$ WE pulse (n=1, 2, ..., N) and a falling edge occurring before a falling edge of the $n^{th}$ WE pulse correspond to a first value (e.g., '1') at the $n^{th}$ position of a row in the table. Pulses of the SARD signal 205 having a rising edge that occurs after a rising edge of a WE pulse and a falling edge occurring after a fatting edge of the WE pulse correspond to a second value (e.g., '0') at a position in the row in the table corresponding to a position of the SARD pulse. Rows of table entries may form patterns that may be categorized as, for example, TOO SLOW, TARGET, or TOO FAST, depending upon observed values of $\{WE_n; n=1, 2, \ldots, N\}$. For example, when N=5, a chip having a table entry (i.e., pattern) of a first type (e.g., 00001 or 00011) may be classified into a first classification (e.g., TOO SLOW); chips having a table entry (i.e., pattern) of a second type (e.g., 00111) may be classified into a second classification (e.g., TARGET, i.e., within an internal signal target range); chips having a table entry (i.e., pattern) of a third type (e.g., 01111 or 11111) may be classified into a third classification (e.g., TOO FAST). A graphical interpretation of the table of FIG. 3A is shown in FIG. 3B that illustrates a value of $T_{SARD}$ 255 that is within an internal signal target range and that, therefore, may correspond to a table entry in FIG. 3A classified as TARGET. According to one embodiment, a value $T_{SPEC}$ 257 may be defined corresponding to a specified maximum value of $T_{SARD}$ 255 used for purposes of commercial marketing and sale.

Returning to FIG. 1, at step 145 results N repetitions of the loop that begins at step 120 may be analyzed, using the table of FIG. 3A as an example, and a chip having a table entry in the TARGET range may be passed at step 150. If the chip has a table entry in either the TOO SLOW or TOO FAST range, then a decision may be made as to whether sufficient adjustments remain in an automatic trimming capability to attempt another adjustment. If so, then the method may continue at step 165 where automatic internal trimming is performed according to the results considered at step 145. A resulting configuration of the chip may be saved at step 170 with the method then continuing at step 105 by initializing the integrated circuit. If, at step 155, sufficient automatic trimming adjustments are not available, then the integrated circuit may be classified as failed at step 160. After either step 150 or step 160, the method may terminate at step 175.

Figure 4:
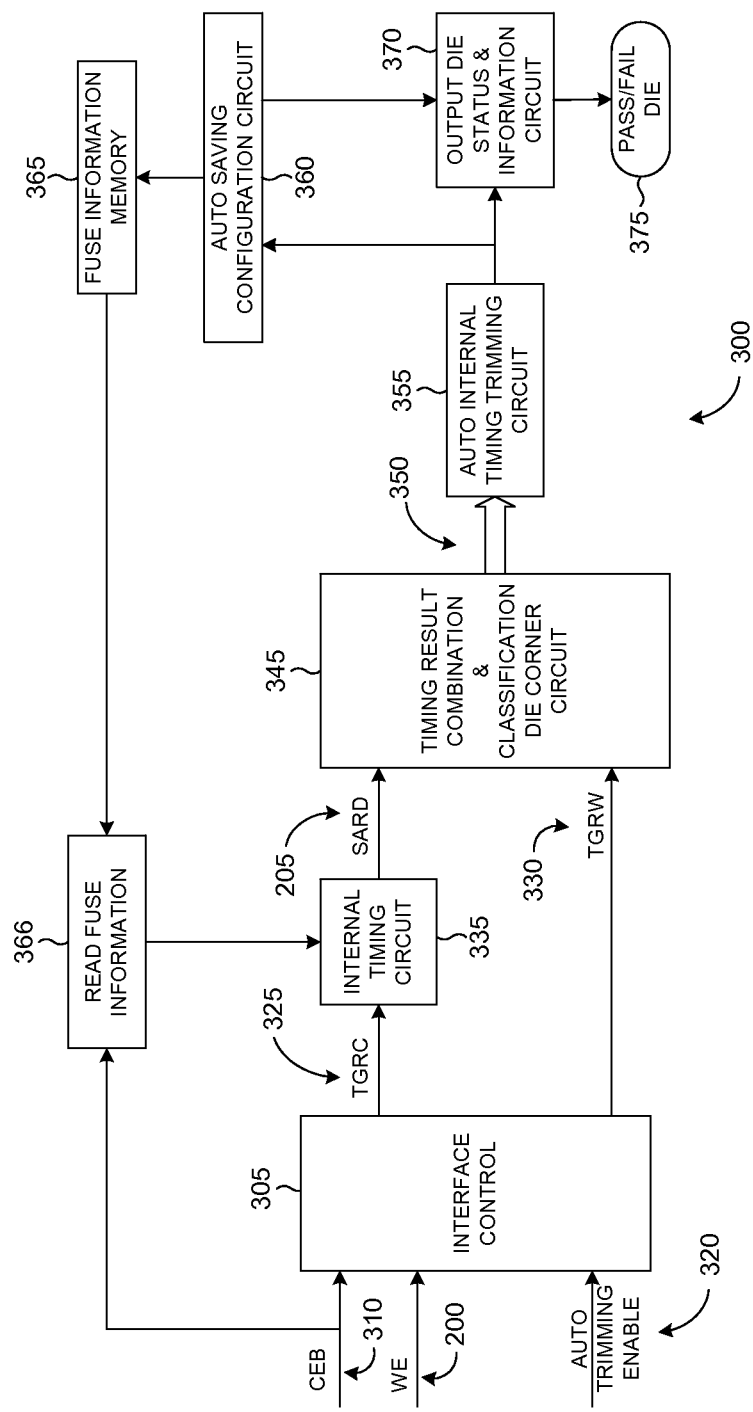
FIG. 4 is a block diagram of an apparatus for automatic trimming an integrated circuit.

FIG. 4, which was introduced above, is a block diagram of a portion 300 of an embodiment of an integrated circuit (e.g., chip) that may support an implementation of the method described in FIG. 1. (Steps in the following refer to step numbers in FIG. 1.) The illustrated chip portion 300 comprises an interface control block 305 adapted to receive a chip select signal CEB 310, a reference signal WE 200, and an automatic trimming enable signal 320. The listed signals may be applied by a testing device (not shown). Application of the chip select signal CEB 310 and the automatic trimming enable signal 320 may implement step 110. The interface control block 305 may generate two internal signals, a TGRC signal 325 and a TGRW signal 330 according to the WE signal 200 as further indicated by step 120. The portion 300 further includes an internal timing circuit 335 and a read fuse information block 366. The internal timing circuit 335 receives fuse information from the read fuse information block 366 and, further, receives the TGRC signal 325 (i.e., a reference timing signal) and generates a SARD signal 205 (cf. step 120) according to the received fuse information and the TGRC signal 325. The SARD signal 205 may be sensitive to, for example, manufacturing process variations and temperature. The SARD signal 205 and the TGRW signal 330 may be measured and compared in a timing result combination & classification die corner circuit 345, which may generate a collection of results 350 comprising a series of values of the WE signal 200 sampled and latched at falling edges of the SARD signal 205 as illustrated in FIG. 2. The measuring of the TGRW signal 330 according to the SARD signal 205 may correspond to step 130. In a typical mode of operation, a reference signal WE 200 is applied (cf. step 115 of FIG. 1), and collection of results 350, which may correspond to a row of the table of FIG. 3A, is produced. An automatic internal timing trimming circuit 355 may receive the collection of results 350 and, if the collection of results 350 forms a pattern in the TARGET range (cf. step 145), may classify the integrated circuit as passed (cf. step 150), thereby obviating any need for automatic internal trimming in the automatic internal timing trimming circuit 355. If the collection of results 350 is not in the TARGET range, then a determination (cf. step 155) may be made as to whether any automatic internal trimming can be performed. If no additional automatic internal trimming can be performed, then the automatic internal timing trimming circuit 355 may classify the integrated circuit as failed (cf. step 160). Otherwise, the automatic internal timing trimming circuit 355 may generate a collection of parameters that may readjust the internal timing circuit 335 (cf. step 165) in order to tend to move the collection of results 350 toward the TARGET range illustrated in FIGS. 3A and 3B. The collection of parameters so generated may be passed to an automatic saving configuration circuit 360, which may save (i.e., store) them (cf. step 170) in fuse information memory 365. The read fuse information block 366, under control of the chip select signal CEB 310 may read the fuse information memory 365, thereby enabling the internal timing circuit 335 to be adjusted.

While the operations described may apply to a single integrated circuit, a similar concept may also apply to a collection of integrated circuits that populate a die during a manufacturing process. The automatic internal timing trimming circuit 355 may pass the collection of parameters generated by the automatic internal timing trimming circuit 355 to an output die status & information circuit 370. Status for each integrated circuit on the die may be monitored by the output die status & information circuit 370 and may be passed to a pass/fail die block 375. An external tester may employ the pass/fail die block 375 to monitor status and function of individual integrated circuits on the die. Automatic internal trimming may thereby decrease testing time and improve yields at a wafer sort and/or final test stage of a manufacturing process.

In view of the foregoing, it will be understood by those skilled in the art that the methods of the present invention can facilitate formation of semiconductor memory devices, and in particular devices having an automatic internal trimming capability. The above-described embodiments have been provided by way of example, and the present invention is not limited to these examples. Multiple variations and modification to the disclosed embodiments will occur, to the extent not mutually exclusive, to those skilled in the art upon consideration of the foregoing description. Additionally, other combinations, omissions, substitutions and modifications will be apparent to the skilled artisan in view of the disclosure herein. Accordingly, the present invention is not intended to be limited by the disclosed embodiments, but is to be defined by reference to the appended claims.

What is claimed is:

1. An integrated circuit having an automatic timing trimming capability, comprising:

an interface control block that receives a chip select signal, an external reference signal, and an automatic trimming enable signal and generates an internal chip control signal and an internal reference signal according to the external reference signal;

an internal timing circuit and a read fuse information block, the internal timing circuit being adapted to receive fuse information from the read fuse information block and generate a read-speed timing reference signal according to the fuse information and the internal chip control signal; and a timing result combination and classification die corner circuit that receives the read-speed timing reference signal and the internal reference signal and generates a plurality of samples of the external reference signal according to the read-speed timing reference signal.

2. The integrated circuit as set forth in claim 1, wherein the read fuse information block is adapted to receive the fuse information from a fuse information memory block.

3. The integrated circuit as set forth in claim 2, further comprising an auto internal timing trimming circuit adapted to receive the plurality of samples of the reference signal, generate a classification of the plurality of samples, and generate a plurality of parameters adapted to adjust the internal timing circuit according to the classification.

4. The integrated circuit as set forth in claim 3, wherein the classification is one of a group consisting of a first classification, a second classification, and a third classification.

5. The integrated circuit as set forth in claim 4, further comprising an auto saving configuration circuit adapted to receive the plurality of parameters and store the plurality of parameters in the fuse information memory block and, when the classification is one of a group consisting of the first classification and the third classification, readjust the internal timing circuit to cause the classification of the plurality of samples to move toward the second classification.

* * * * *